(12) United States Patent
McLaughlin et al.

(10) Patent No.: US 9,743,554 B2
(45) Date of Patent: Aug. 22, 2017

(54) HEAT DISSIPATION IN ELECTRONICS WITH A HEAT SPREADER

(71) Applicant: Microsoft Technology Licensing, LLC, Redmond, WA (US)

(72) Inventors: Robyn Rebecca Reed McLaughlin, Seattle, WA (US); Jeffrey Taylor Stellman, San Francisco, CA (US); Andrew Hill, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 14/944,263

(22) Filed: Nov. 18, 2015

(65) Prior Publication Data

US 2017/0142861 A1 May 18, 2017

(51) Int. Cl.
*H05K 7/20* (2006.01)
*G06F 1/20* (2006.01)

(52) U.S. Cl.
CPC .............. *H05K 7/2039* (2013.01); *G06F 1/20* (2013.01)

(58) Field of Classification Search
CPC . G06F 1/181–1/182; H05K 7/20218–7/20381;
(Continued)

(56) References Cited

U.S. PATENT DOCUMENTS 6,257,328 B1   7/2001   Fujiwara et al.
7,161,809 B2   1/2007   Ford et al.
(Continued)

FOREIGN PATENT DOCUMENTS

CN   203014901 U   6/2013
CN   104333620 A   2/2015
(Continued)

OTHER PUBLICATIONS

Kai, et al., "Designing Great 2 in 1 Devices", Retrieved on: Jul. 20, 2015.

(Continued)

*Primary Examiner* — Anthony Haughton
*Assistant Examiner* — Razmeen Gafur
(74) *Attorney, Agent, or Firm* — Lempia Summerfield Katz LLC

(57) ABSTRACT

Heat dissipation configurations and methods are described herein. Certain electronic devices may include an individual piece of thermally conductive material having a first surface and a second surface. A first section of the thermally conductive material may be positioned between a motherboard and a backing layer of an electronic device such that the first surface of the first section is adjacent to the motherboard and the second surface of the first section is adjacent to the backing layer. A second section of the thermally conductive material may be positioned between a display module and a battery of the electronic device such that the first surface of the second section is adjacent to a back plate of the display module and the second surface of the second section is adjacent to the battery. The thermally conductive material may be configured to transfer heat between the first section and the second section.

20 Claims, 4 Drawing Sheets

(58) Field of Classification Search
CPC ............. H05K 7/20409–7/20418; H05K 7/20009–7/202; H01L 23/367–23/3677; H01L 23/473; H01L 23/46–23/467
USPC ...... 361/676–678, 679.46–679.54, 688–727, 361/679.01–679.45, 679.55–679.61; 165/80.1–80.5, 104.33, 185; 174/15.1–15.3, 16.1–16.3, 547, 548; 257/712–722, E23.088; 24/453, 458–459; 454/184; 312/236; 455/575.1–575.9; 349/56–60
See application file for complete search history.

(56) References Cited

U.S. PATENT DOCUMENTS

| | | | |
|---|---|---|---|
| 7,861,768 B1 | 1/2011 | Ghantiwala | |
| 7,965,514 B2 | 6/2011 | Hill et al. | |
| 8,955,580 B2 | 2/2015 | Chen et al. | |
| 2004/0132514 A1* | 7/2004 | Lee | H04M 1/0266 455/575.3 |
| 2005/0006055 A1* | 1/2005 | Colbert | H01L 23/4006 165/80.3 |
| 2006/0126304 A1 | 6/2006 | Smalc et al. | |
| 2007/0230132 A1* | 10/2007 | Lee | H05K 7/20963 361/707 |
| 2008/0019502 A1* | 1/2008 | Emmert | H04M 1/026 379/433.07 |
| 2010/0120479 A1* | 5/2010 | Ogatsu | G06F 1/1624 455/575.4 |
| 2010/0137043 A1* | 6/2010 | Horimoto | H04M 1/236 455/575.7 |
| 2011/0045879 A1* | 2/2011 | Kim | H04M 1/0237 455/575.4 |
| 2011/0077063 A1* | 3/2011 | Yabe | H04M 1/0237 455/575.4 |
| 2011/0105204 A1* | 5/2011 | Kouno | H04M 1/0237 455/575.4 |
| 2011/0130178 A1* | 6/2011 | Shin | H04M 1/0237 455/575.4 |
| 2011/0143825 A1* | 6/2011 | Ahn | H04M 1/026 455/575.4 |
| 2011/0279969 A1* | 11/2011 | Memon | G06F 1/20 361/679.47 |
| 2012/0033384 A1 | 2/2012 | Pillai | |
| 2012/0238333 A1* | 9/2012 | Mori | H04M 1/0235 455/575.4 |
| 2012/0309473 A1* | 12/2012 | Choo | G06F 1/1656 455/575.7 |
| 2013/0005409 A1* | 1/2013 | Okamoto | H04M 1/18 455/575.1 |
| 2013/0005411 A1* | 1/2013 | Kitamura | H04M 1/0237 455/575.4 |
| 2013/0136966 A1 | 5/2013 | Bhardwaj | |
| 2013/0165189 A1* | 6/2013 | Shoji | G06F 1/16 455/575.1 |
| 2013/0213630 A1 | 8/2013 | Southard | |
| 2013/0225247 A1* | 8/2013 | Kim | H04M 1/0202 455/575.1 |
| 2013/0264041 A1 | 10/2013 | Zhamu et al. | |
| 2013/0267284 A1* | 10/2013 | Ryu | H04W 88/06 455/575.7 |
| 2013/0303243 A1* | 11/2013 | Park | H04M 1/0206 455/575.7 |
| 2014/0043754 A1 | 2/2014 | Hartmann et al. | |
| 2014/0162736 A1* | 6/2014 | Shin | H04B 1/3888 455/575.8 |
| 2014/0239479 A1 | 8/2014 | Start | |
| 2014/0243052 A1* | 8/2014 | Hobson | H01Q 1/243 455/575.7 |
| 2014/0376178 A1* | 12/2014 | Moore | G06F 1/20 361/679.53 |
| 2015/0075186 A1 | 3/2015 | Prajapati | |
| 2015/0119111 A1 | 4/2015 | Honmura et al. | |
| 2015/0241935 A1 | 8/2015 | Jang et al. | |
| 2016/0087669 A1* | 3/2016 | Kang | H04M 1/026 455/575.8 |
| 2016/0088130 A1* | 3/2016 | Jung | G06F 1/1626 455/575.1 |

FOREIGN PATENT DOCUMENTS

| | | |
|---|---|---|
| EP | 0971407 A1 | 1/2000 |
| WO | 2014134791 A1 | 9/2014 |

OTHER PUBLICATIONS

"International Search Report & Written Opinion Issued in PCT Application No. PCT/US2016/061767", Mailed Date: Jan. 31, 2017, 13 Pages.

* cited by examiner

HEAT DISSIPATION IN ELECTRONICS WITH A HEAT SPREADER

DESCRIPTION OF THE DRAWING FIGURES

For a more complete understanding of the disclosure, reference is made to the following detailed description and accompanying drawing figures, in which like reference numerals may be used to identify like elements in the figures.

Figure 1:
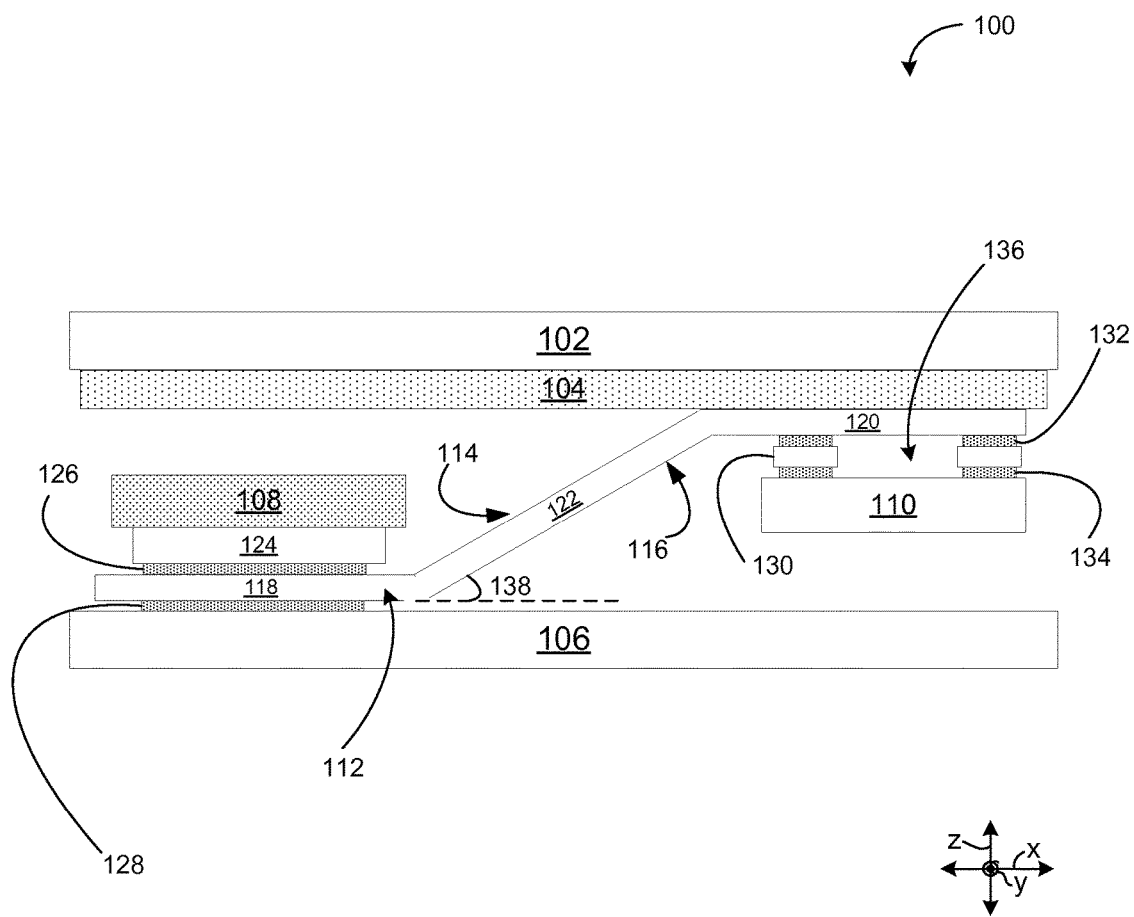
FIG. 1 depicts an example of a side-view of an electronic device having a heat spreader.

While the disclosed devices, systems, and methods are representative of embodiments in various forms, specific embodiments are illustrated in the drawings (and are hereafter described), with the understanding that the disclosure is intended to be illustrative, and is not intended to limit the claim scope to the specific embodiments described and illustrated herein.

DETAILED DESCRIPTION

Current microprocessor design trends include designs having an increase in power, a decrease in size, and an increase in speed. This results in higher power in a smaller, faster microprocessor. Another trend is towards lightweight and compact electronic devices. As microprocessors become lighter, smaller, and more powerful, they also generate more heat in a smaller space, making thermal management a greater concern than before.

The purpose of thermal management is to maintain the temperature of a device within a moderate range. During operation, electronic devices dissipate power as heat, which must be removed from the device. Otherwise, the electronic device will get hotter and hotter until it fails, reducing its service life. Short of failure, electronic devices run slowly and dissipate power poorly at high temperatures.

Disclosed herein are apparatuses, systems, and methods for improved heat dissipation from an electronic device. Such heat dissipation apparatuses, systems, or methods have several potential end-uses or applications, including any electronic device having a passive or an active cooling component (e.g., fan). For example, the heat dissipation apparatus may be incorporated into personal computers, server computers, tablet or other handheld computing devices, laptop or mobile computers, communications devices such as mobile phones, multiprocessor systems, microprocessor-based systems, set top boxes, programmable consumer electronics, network PCs, minicomputers, mainframe computers, or audio or video media players. In certain examples, the heat dissipation apparatus may be incorporated within a wearable electronic device, wherein the device may be worn on or attached to a person's body or clothing. The wearable device may be attached to a person's shirt or jacket; worn on a person's wrist, ankle, waist, or head; or worn over their eyes or ears. Such wearable devices may include a watch, heart-rate monitor, activity tracker, or head-mounted display.

As used herein, "active cooling" may refer to the use of forced fluid movement (e.g. fans moving air or pumps moving water) to reduce the heat of a component (e.g., a microprocessor) of the electronic device. Active cooling contrasts with "passive cooling," which utilizes non-forced methods of cooling such as natural convection or radiation or involves reducing the speed at which a component (e.g., a microprocessor) is running to reduce the component's heat.

Improved heat dissipation within an electronic device may be implemented by providing or forming an individual piece of thermally conductive material comprising a first surface and a second surface. A first section of the thermally conductive material may be positioned between a motherboard and a backing layer of an electronic device such that the first surface of the first section is adjacent to the motherboard and the second surface of the first section is adjacent to the backing layer. Additionally, a second section of the thermally conductive material may be positioned between a display module and a battery of the electronic device such that the first surface of the second section is adjacent to a back plate of the display module and the second surface of the second section is adjacent to the battery. In such an arrangement, the electronic device may be configured to transfer heat between the first section and the second section of the individual piece of thermally conductive material.

Using one or more of these features described in greater detail below, improved heat dissipation may be provided for the electronic device. With the improved heat dissipation feature, a more powerful microprocessor may be installed for the electronic device, a thinner electronic device may be designed, a higher processing speed may be provided, or a combination thereof when compared to a similar electronic device without one or more of the improved heat dissipation features. In other words, the heat dissipation features described herein may provide improved thermal management for an electronic device such as a mobile phone, tablet computer, or laptop computer.

Heat Dissipation Features

FIG. 1 depicts a non-limiting example of an electronic device 100 having a display screen or display module 102. The display module 102 may be a touch display module. The display module 102 may include a light-emitting device such as a liquid crystal display (LCD) or a light emitting diode (LED) (e.g., an organic light emitting diode (OLED)). The LCD or LED may be disposed in, or configured as, a film. The configuration, construction, materials, and other aspects of the light emitting devices may vary. For instance, III-V semiconductor-based LED structures may be used to fabricate micron-sized LED devices. The small thickness of such structures allows the light emitting devices to be disposed in planar arrangements (e.g., on or in planar surfaces) and thus, distributed across the viewable area of the display. Non-LED technologies, such as finely tuned quantum dot-based emission structures, may also be used. Other thin form factor emission technologies, whether developed, in development, or future developed, may be used within the display module 102.

In certain examples, the display module includes a back plate 104. The back plate 104 may be bonded (e.g., adhesively bonded) to the LCD or LED. The back plate 104 may be made of a thermally conductive material such as stainless steel, copper, aluminum, gold, silver, tungsten, or a composite or an alloy thereof. In one particular example, the back plate 104 includes stainless steel. In another example, the back plate 104 includes aluminum. The conductivity of the back plate 104 may be advantageous because it may allow heat generated from the electronic device 100 to be dissipated along the length of the back plate 104, instead of in a localized region of the back plate 104.

The electronic device 100 further includes a backing layer 106 or bucket. The backing layer 106 is positioned on the rear end of the electronic device 100 such that the display module 102 and backing layer 106 bookend the internal components of the electronic device 100. The backing layer 106 may be made of any variety of materials now known or later developed such as metals, plastics, polymers, ceramics, or combinations thereof. The backing layer 106, for instance, may be formed from one or more sub-layers of a polymer or mixture of polymers. For example, the backing layer 106 may be formed from polymers such as thermoplastic polymers, silicones, or polyurethanes. In some examples, the backing layer 106 is formed from a polyurethane laminate, where a cloth fabric is laminated onto a thin film of polyurethane.

Positioned between the back plate 104 of the display module 102 and the backing layer 106 are the internal components of the electronic device 100. One internal component is a circuit board or motherboard 108. The motherboard 108 may be configured to hold and allow communication between one or more central processing units (CPUs) and memories. The motherboard 108 may also be configured to provide connections to sound cards, video cards, network cards, hard drives, or other forms of storage. The motherboard 108 may also be configured to provide connections to one or more peripherals (e.g., a keyboard, mouse, serial port, parallel port, Firewire/IEEE 1394a, universal serial bus (USB), Ethernet, audio). The motherboard and its connected components (e.g., CPU) provide a source of the heat generated during operation of the electronic device.

Another internal component within the electronic device 100 is the battery 110. In certain examples, the electronic device may include a plurality (i.e., 2 or more) of batteries. The battery 110 may be any type of battery now known or later developed. In certain examples, the battery is a secondary or rechargeable battery (e.g., a metal ion or metal air battery such as a lithium air or lithium ion battery). In some examples, the battery may be in the same plane as the motherboard (e.g., the same x-y plane, as depicted in FIG. 1). In other examples, the battery may be in a different plane from the motherboard, wherein the battery plane is parallel with the motherboard plane (e.g., the x-y plane of the battery is at a different z height from the x-y plane of the motherboard).

A thermally conductive material or heat spreader 112 is also positioned between the display module 102 and backing layer 106. As depicted in FIG. 1, the heat spreader 112 is positioned such that it extends from a location near the backing layer 106 to a separate location near the back plate 104 of the display module 102. This configuration is advantageous as the heat spreader 112 may transfer heat generated from one side of the electronic device 100 and transfer it to the opposite side.

For example, the heat spreader 112 may be configured to transfer heat generated near the backing layer 106 (e.g., from the motherboard) to an area near the back plate 104 of the display module 102. In an alternative example, the heat spreader 112 may be configured to transfer heat generated near the back plate 104 (e.g., from the battery) to an area near the backing layer 106 of the electronic device 100. In other words, a single heat spreader 112 may be configured to utilize both surfaces of the electronic device 100 and dissipate heat through both surfaces. With this improved heat dissipation feature, a more powerful microprocessor may be installed for the electronic device, a thinner electronic device may be designed, a higher processing speed may be provided, or a combination thereof when compared to a similar electronic device without the heat spreader 112.

For example, an electronic device 100 may have a maximum desirable surface or touch temperature (e.g., 48° C.). With the improved heat dissipation feature, the processor may be able to process more power (e.g., Watts) without exceeding the touch temperature. In certain examples, with the improved heat dissipation, the electronic device may be able to process at least an additional 1 Watt, 2 Watts, 3 Watts, 4 Watts, 5 Watts, or 10 Watts of power without exceeding the maximum touch temperature when compared to a similar device without the heat spreader 112.

The heat spreader 112 is made of a thermally conductive material. The thermally conductive material may have a high thermal conductivity (e.g., a thermal conductivity greater than 100 W/(m·K), 150 W/(m·K), 200 W/(m·K), 300 W/(m·K), or 400 W/(m·K)). For example, the thermally conductive material may be copper, aluminum, gold, silver, tungsten, or an alloy thereof. In one particular example, the thermally conductive material includes a copper metal or a copper alloy. In another example, the thermally conductive material includes graphite.

In certain examples, the heat spreader is an individual piece of thermally conductive material. In other examples, the heat spreader includes a plurality of thermally conductive segments of material that are connected or joined together. The segments may be connected by soldering or sintering the segments together. In other examples, the segments may be connected through use of an intermediate adhesive layer. In yet other examples, the segments may be connected by affixing a portion of a surface of one segment against a surface of the second segment (e.g., without any adhesive or bonding).

As depicted in FIG. 1, the heat spreader 112 is an individual piece of thermally conductive material. The heat spreader 112 includes a first surface 114 and a second surface 116 opposite the first surface 114. The heat spreader 112 also includes a first section 118, a second section 120, and a connecting section 122.

The first section 118 of the heat spreader 112 is positioned between the motherboard 108 and the backing layer 106 of the electronic device 100 such that the first surface 114 of the first section 118 is adjacent to the motherboard 108 and the second surface 116 of the first section 118 is adjacent to the backing layer 106. In some examples, the first surface 114 of the first section 118 is in physical contact with a surface of the motherboard 108. This may be advantageous because the heat generated from the motherboard 108 during operation of the electronic device 100 may be transferred directly to the heat spreader 112 to be dissipated to both sides of the device (e.g., the backing layer 106 and display module 102).

In other examples, one or more intermediate layers may be positioned between the first surface 114 of the first section 118 and the motherboard 108. For example, a heat dissipation apparatus 124 may be positioned between the heat spreader 112 and the motherboard 108. The heat dissipation apparatus 124 may be a vapor chamber, heat sink, heat fin, or heat pipe. The placement of the heat dissipation apparatus 124 between the motherboard 108 and heat spreader 112 may be advantageous is withdrawing heat from the motherboard 108 and transferring the withdrawn heat along the heat spreader 112.

An adhesive layer 126 may be positioned between the heat spreader 112 and the motherboard 108 or heat dissipation apparatus 124. The adhesive layer 126 may be made of type of adhesive composition now known or later developed. For example, the adhesive layer 126 may include a non-reactive adhesive composition such as a pressure-sensitive adhesive (PSA), drying adhesive, or contact adhesive. In one example, the adhesive layer 126 includes a pressure-sensitive adhesive having an elastomer compounded with a tackifier (e.g., a rosin ester). The elastomer of the PSA may be an acrylic, butyl rubber, ethylene-vinyl acetate, natural rubber, nitrile, silicone rubber, vinyl ether, or styrene block copolymer (e.g., styrene-butadiene-styrene, styrene-ethylene/butylene-styrene, styrene-ethylene/propylene, or styrene-isoprene-styrene). Advantages of such adhesive materials include their ability to apply strong adhesion between adjacent layers while remaining thin and not adding a relatively high amount of weight to the electronic device.

In certain examples, the second surface 116 of the first section 118 is in physical contact with a surface of the backing layer 106. In other examples, one or more intermediate layers may be positioned between the second surface 116 of the first section 118 and the backing layer 106. For example, an adhesive layer 128 may be positioned between the heat spreader 112 and backing layer 106. As noted above, the adhesive layer may be made of any type of adhesive composition now known or later developed.

The second section 120 of the heat spreader 112 is positioned between the back plate 104 of the display module 102 and the battery 110 such that the first surface 114 of the second section 120 is adjacent to the back plate 104 and the second surface 116 of the second section 120 is adjacent to the battery. In some examples, the first surface 114 of the second section 120 is in physical contact with a surface of the back plate 104. In other examples, one or more intermediate layers may be positioned between the first surface 114 of the second section 120 and the back plate 104. For example, an adhesive layer may be positioned between the heat spreader 112 and back plate 104.

In certain examples, the second surface 116 of the second section 120 is in physical contact with a surface of the battery 110. In other examples, one or more intermediate layers may be positioned between the second surface 116 of the second section 120 and the battery 110. For example, a compressible layer 130 may be positioned between the heat spreader 112 and the battery 110. The compressible layer 130 may be configured to have a variable layer thickness or height (e.g., in the z-direction) based upon the amount of pressure applied to the material. For example, an increase in pressure may reduce the height of the compressible layer while a reduction in pressure may increase the height of the compressible layer up to a maximum height.

In certain examples, an initial or desired thickness of the compressible layer 130 upon manufacturing of the electronic device 100 may be such that the compressible layer 130 exerts a certain amount of pressure on the second surface 116 of the second section 120 of the heat spreader 112, which in turn applies a certain amount of pressure on the back plate 104. This may be advantageous in that the heat spreader may remain in contact through pressure of the compressible layer 130 and not through use of an adhesive layer. This may allow for easier maintenance and repair of the device as the back plate may more readily be removed from the heat spreader without an intermediate adhesive layer. Furthermore, having a compressible material allows for the pressure against the back plate to remain steady for a majority of fluctuations in height of the compressible layer 130 during use (e.g., during expansion of the battery). In certain examples, the compressible layer 130 has a maximum compressibility (100% compression) and a maximum expansion (0% compression). In some examples, the initial thickness of the compressible layer 130 upon manufacture of the electronic device 100 is from 25% to 75%, 30% to 70%, 40% to 60%, or 50% of the compressibility of the material.

The compressible layer 130 may be made of any compressible composition now known or later developed. In some examples, the compressible layer 130 is made of a foam composition. The foam composition may be an open-cell-structured foam or closed-cell foam. Open-cell-structured foams include pores that are connected to each other and form an interconnected network that is relatively soft. Foam rubber is a type of open-cell foam. Closed-cell foams do not have interconnected pores. Certain examples of closed-cell foams include syntactic foams, which have particles embedded in a matrix material. The spheres can be made from several materials, including glass, ceramic, and polymers. The advantage of syntactic foams is that they have a very high strength-to-weight ratio. One particular syntactic foam employs shape memory polymer as its matrix, allowing the foam to take on the characteristics of shape memory resins and composite materials. That is, the foam has the ability to be reshaped repeatedly when heated above a certain temperature and cooled, which may be advantageous within an electronic device that generates heat during use.

In some examples, the compressible layer 130 may be affixed to the heat spreader by an adhesive layer 132. Additionally, the compressible layer 130 may be affixed to the battery 110 by a separate adhesive layer 134. As noted above, these adhesive layers may be made of any type of adhesive composition now known or later developed.

In certain examples, the compressible layer 130 includes an opening 136 within a center area of the battery 110. This is advantageous as it allows the battery to expand in the z-direction toward the back plate 104 of the display module 102 without adversely affecting the amount of pressure applied by the heat spreader 112 on the back plate 104. In certain cases, after prolonged battery life, the battery may begin to swell and expand outwardly along the z-axis toward the back plate and backing layer. In some cases, the swelling is within the center area of the battery. Therefore, it is advantageous to provide an opening 136 in the central area of the compressible layer 130, allowing for battery expansion without adversely compressing the compressible layer beyond its operable limits and increasing the pressure on the back plate.

Figure 2:
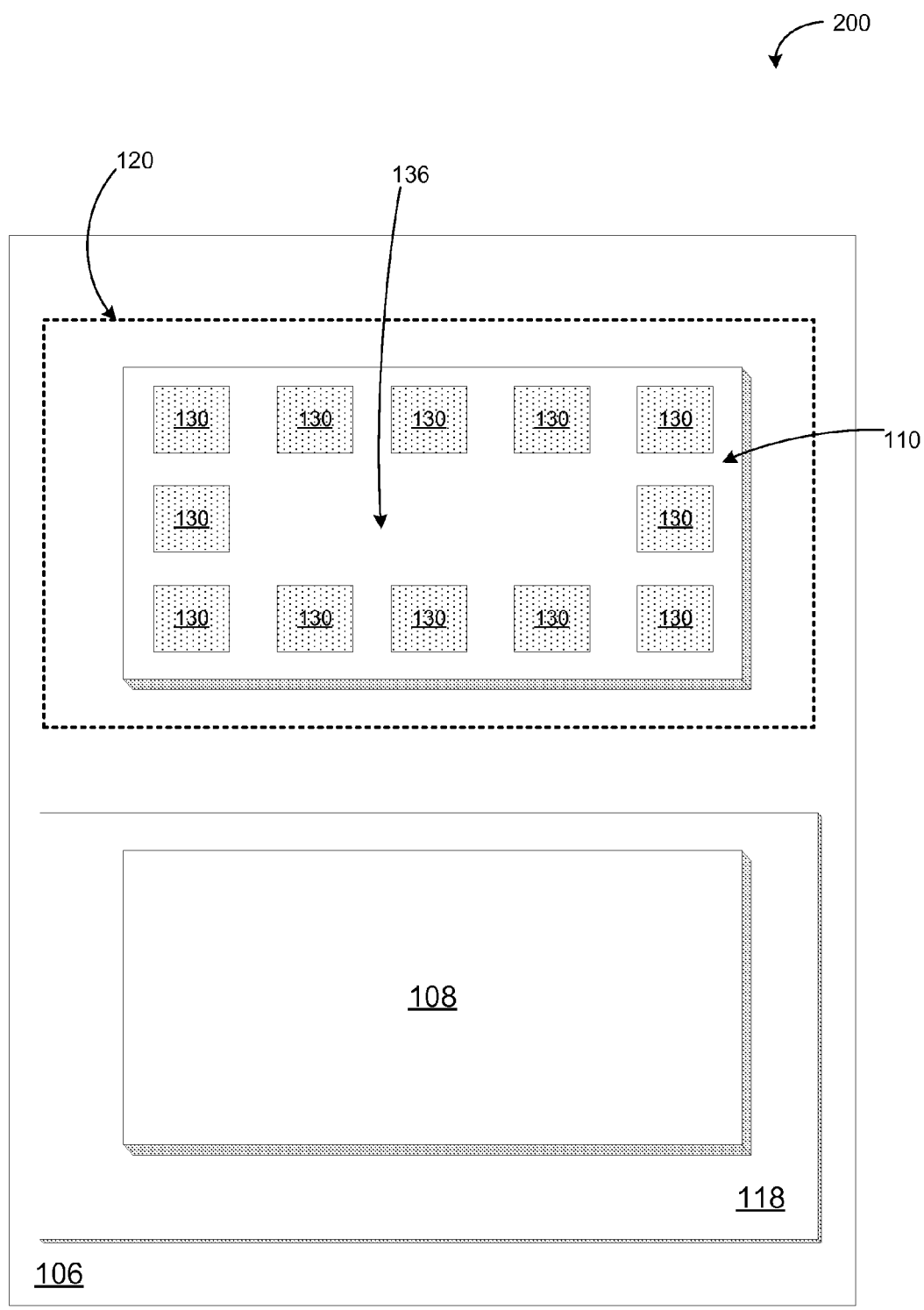
FIG. 2 depicts an example of a top-down perspective of various components of an electronic device.
Figure 2:
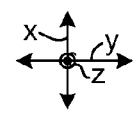

FIG. 2 depicts an alternative, top-down perspective of an electronic device 200 with the compressible layer 130 discussed above. The top-down perspective depicts a limited number of the components within the environment depicted in FIG. 1. For example, FIG. 2 depicts a backing layer 106 or bucket as an external base layer. The first section 118 of the heat spreader 112 is positioned above the backing layer 106 (as viewed along the z-axis). The motherboard is positioned above the first section 118 of the heat spreader 112.

Additionally, FIG. 2 depicts a battery 110 positioned above the backing layer 106. The compressible layer 130 is positioned above the battery 110. Also, as shown in dashed line, the second section 120 of the heat spreader 112 is positioned above the compressible layer.

As depicted in FIG. 2, the compressible layer 130 includes a plurality of segments positioned on a surface of the battery 110. Adhesive material may be positioned between the compressible layer segments and the battery 110 to adhere the compressible layer 130 to the battery 110. An opening 136 in the compressible layer is provided within the center area of the battery 110. As noted above, this is advantageous for any swelling or expansion of the battery 110 in the z-direction.

In certain examples, the first section 118 of the heat spreader 112 is positioned in a first plane and the second section 120 of the heat spreader 112 is positioned in a second plane separate from the first plane. The first and second planes may be parallel with each other. For example, as depicted in FIG. 1, the first section 118 is in a first x-y plane and the second section 120 is in a second x-y plane, parallel with the first x-y plane, but at a different z-height.

In some examples, the first section 118 of the heat spreader 112 in the first plane is joined with the second section 120 of the heat spreader 112 in the second plane by positioning a portion of the second surface 116 of the second section 120 on top of a portion of the first surface 114 of the first section 118. The two sections may be part of a same individual piece of conductive material, or may be separate pieces of conductive material. The separate pieces of conductive material may be sintered or soldered together, adhered together via an intermediate adhesive layer, or connected with each other by any known or later developed material or method. Alternatively, the separate pieces of conductive material may only be connected together through physical contact without any further adhesion, sintering, soldering, or other permanent connection mechanism or method to each other.

In other examples, the first section 118 of the heat spreader 112 in the first plane is joined with the second section 120 of the heat spreader 112 in the second plane by a connecting section 122. The connecting section 122 may extend from an end of the first section 118 in the first plane to an end of the second section 120 in the second plane. The first section 118, second section 120, and connecting section 122 may be part of a same individual piece of conductive material that has been shaped into the described arrangement (e.g., as depicted in FIG. 1). In other examples, the first section 118, second section 120, and connecting section 122 are separate pieces of conductive material. The separate pieces of conductive material may be sintered or soldered together, adhered together via intermediate adhesives layer, or connected with each other by any known or later developed material or method. Alternatively, the separate pieces of conductive material may only be connected together through physical contact without any further adhesion, sintering, soldering, or other permanent connection mechanism or method to each other.

The connecting section, as depicted in FIG. 1, may lie in a third plane, where the third plane is a separate plane from the first plane of the first section and the second plane of the second section. The transition from the first plane of the first section to the third plane of the connecting section may have a slope or angle of inclination 138 that is 45 degrees or less, 30 degrees or less, 15 degrees or less, 10 degrees or less, 5 degrees or less, 4 degrees or less, 3 degrees or less, 2 degrees or less, or 1 degree or less. A low angle of inclination 138 may be advantageous is allowing heat to be transferred more readily from one section to another section of the heat spreader. In other words, the angle of inclination 138 may be inversely proportional to the heat dissipation capability of the heat spreader (i.e., a higher angle has lower heat dissipation).

The dimensions (e.g., length, width, height, perimeter, surface area) of each section of the heat spreader 112 may be configurable based on the size of the electronic device 100 and the additional internal components within the electronic device 100. In certain examples, the height or thickness of each section of the heat spreader 112 (as measured in the z-direction in FIG. 1) may individually be 1 µm-1 cm, 1 µm-1 mm, 1-100 µm, or 10-100 µm. The length and width of a section of the heat spreader 112 may be configured to be at least as long and wide as the internal component connected with the section. For example, the dimensions of the first section 118 may include a length and width that is equal to or greater than the length and width of the motherboard 108 or heat dissipation apparatus 124. Also, the dimensions of the second section 120 may have a length and width that is equal to or greater than the length and width of the battery 110.

The electronic device 100 may include additional internal components between the back plate 104 of the display module 102 and the backing layer 106. For example, the electronic device 100 may include an active cooling source (e.g., a fan). The fan, when active, may drive air through areas or channels within the internal area of the electronic device to assist in removing heat from the electronic device.

Exemplary Method for Making Heat Dissipation Apparatus

Figure 3:
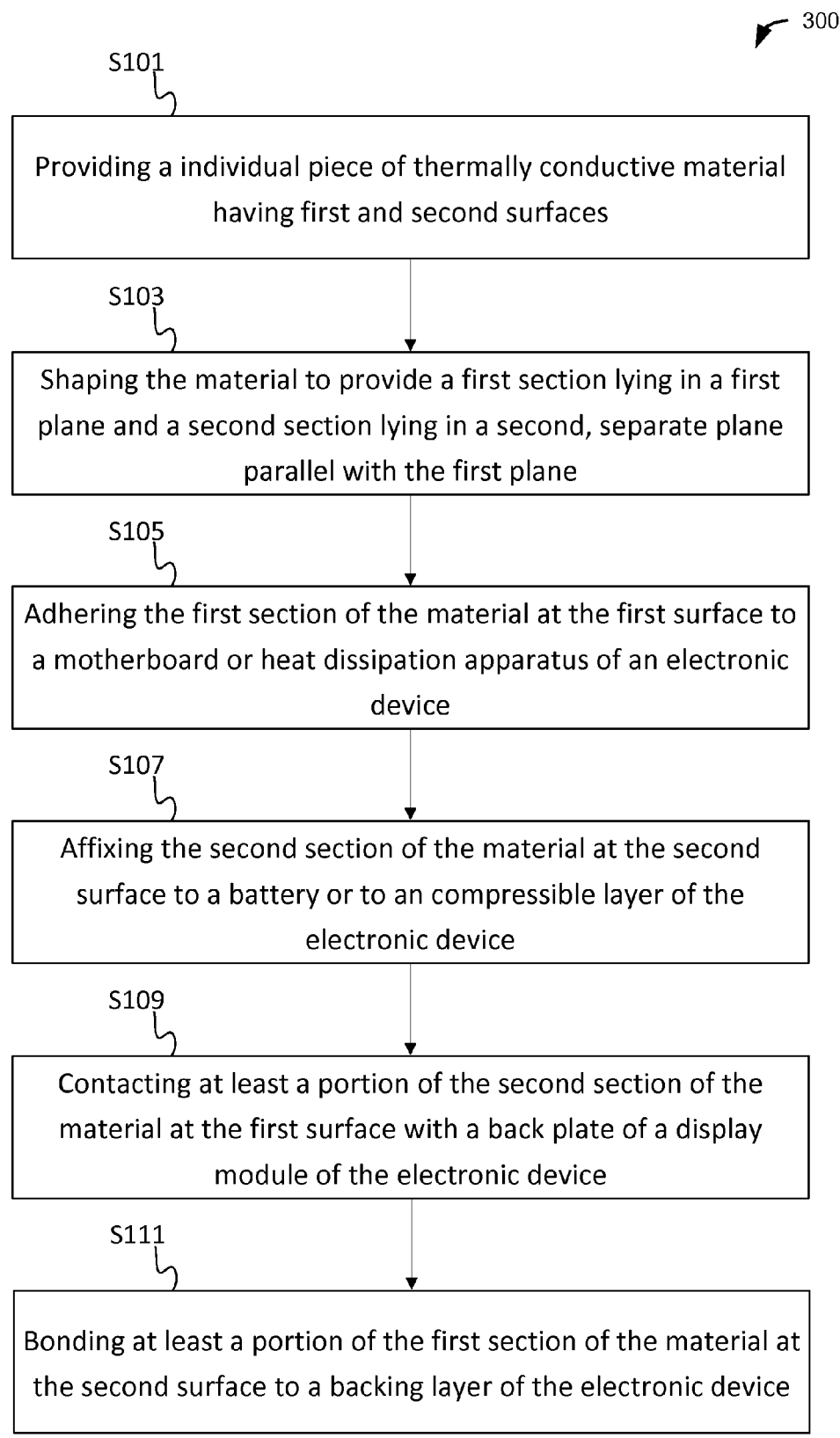
FIG. 3 is a flow diagram of a method of making an electronic device having a heat spreader in accordance with one example.

FIG. 3 depicts an exemplary method 300 for making a heat dissipation apparatus. At act S101, a heat spreader or individual piece of thermally conductive material is provided. The piece of thermally conductive material includes a first surface and a second surface. The material may have a high thermal conductivity (e.g., a thermal conductivity greater than 100 W/(m·K), 150 W/(m·K), 200 W/(m·K), 300 W/(m·K), or 400 W/(m·K)). The heat spreader may be copper, aluminum, gold, silver, tungsten, or an alloy thereof. In one particular example, the heat spreader includes a copper metal or a copper alloy. In another example, the heat spreader includes graphite.

At act S103, the heat spreader or thermally conductive material is shaped into a configuration to provide a first section positioned in a first plane, and a second section positioned in a second, separate plane (e.g., such that the first plane lies in an x-y plane, and the second plane is in an x-y plane at a different z-height). The material may be shaped by any method now known or later developed. For example, the material may be heated to provide increased malleability. The material may then be hammered or shaped into the desired form. Alternatively, the material may be heated above a phase change temperature, wherein the solid material (e.g., metal) transforms into a liquid state. Within the liquid state, the material may be poured into a cast of the desired shape having a first section and a separate second section.

At act S105, a portion of the first section of the heat spreader may be adhered or placed against a surface of a motherboard of the electronic device. Alternatively, the portion of the first section may be adhered or placed against a surface of a heat dissipation apparatus (e.g., vapor chamber, heat sink, heat fin, or heat pipe) of the electronic device. In either example, the first surface of the heat spreader is contacted with the motherboard or heat dissipation apparatus. The first surface at the first section of the heat spreader may be connected to the motherboard or heat dissipation apparatus with an adhesive material (e.g., a pressure-sensitive adhesive).

At act S107, a portion of the second section of the heat spreader may be adhered or placed against a surface of a battery of the electronic device. Alternatively, the portion of the second section may be adhered or placed against a surface of a compressible layer (e.g., foam layer) of the electronic device. In either example, the second surface of the heat spreader is contacted with the battery or compressible layer. The second surface at the second section of the heat spreader may be connected to the battery or compressible layer with an adhesive material (e.g., a pressure-sensitive adhesive).

At act S109, a portion of the second section at the first surface of the heat spreader may be adhered or placed against a back plate of a display module of the electronic device. In certain examples, no adhesive material is used to position the first surface of the heat spreader against the surface of the back plate. In some examples, the compressible layer is configured to provide a desired amount of pressure between the heat spreader and back plate, therein maintaining contact between the two layers during use of the electronic device.

At act S111, a portion of the first section at the second surface is adhered or placed against a backing layer of the electronic device. In certain examples, an adhesive material is used to bond the portion of the first section at the second surface against the surface of the backing layer.

Exemplary Computing Environment

Figure 4:
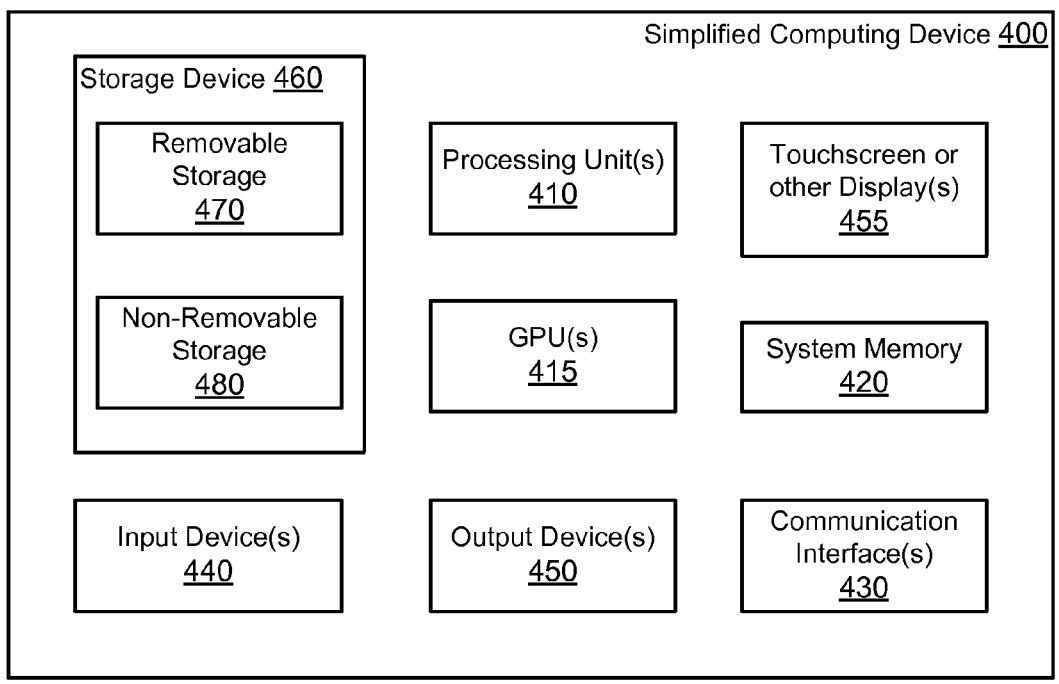
FIG. 4 is a block diagram of a computing environment in accordance with one example for implementation of the disclosed methods or one or more electronic devices.

With reference to FIG. 4, a heat dissipation apparatus as described above may be incorporated within an exemplary computing environment 400. The computing environment 400 may correspond with one of a wide variety of computing devices, including, but not limited to, personal computers (PCs), server computers, tablet and other handheld computing devices, laptop or mobile computers, communications devices such as mobile phones, multiprocessor systems, microprocessor-based systems, set top boxes, programmable consumer electronics, network PCs, minicomputers, mainframe computers, or audio or video media players. In certain examples, the computing device may be a wearable electronic device, wherein the device may be worn on or attached to a person's body or clothing. The wearable device may be attached to a person's shirt or jacket; worn on a person's wrist, ankle, waist, or head; or worn over their eyes or ears. Such wearable devices may include a watch, heart-rate monitor, activity tracker, or head-mounted display.

The computing environment 400 has sufficient computational capability and system memory to enable basic computational operations. In this example, the computing environment 400 includes one or more processing unit(s) 410, which may be individually or collectively referred to herein as a processor. The computing environment 400 may also include one or more graphics processing units (GPUs) 415. The processor 410 and/or the GPU 415 may include integrated memory and/or be in communication with system memory 420. The processor 410 and/or the GPU 415 may be a specialized microprocessor, such as a digital signal processor (DSP), a very long instruction word (VLIW) processor, or other microcontroller, or may be a general-purpose central processing unit (CPU) having one or more processing cores. The processor 410, the GPU 415, the system memory 420, and/or any other components of the computing environment 400 may be packaged or otherwise integrated as a system on a chip (SoC), application-specific integrated circuit (ASIC), or other integrated circuit or system.

The computing environment 400 may also include other components, such as, for example, a communications interface 430. One or more computer input devices 440 (e.g., pointing devices, keyboards, audio input devices, video input devices, haptic input devices, or devices for receiving wired or wireless data transmissions) may be provided. The input devices 440 may include one or more touch-sensitive surfaces, such as track pads. Various output devices 450, including touchscreen or touch-sensitive display(s) 455, may also be provided. The output devices 450 may include a variety of different audio output devices, video output devices, and/or devices for transmitting wired or wireless data transmissions.

The computing environment 400 may also include a variety of computer readable media for storage of information such as computer-readable or computer-executable instructions, data structures, program modules, or other data. Computer readable media may be any available media accessible via storage devices 460 and includes both volatile and nonvolatile media, whether in removable storage 470 and/or non-removable storage 480. Computer readable media may include computer storage media and communication media. Computer storage media may include volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which may be used to store the desired information and which may accessed by the processing units of the computing environment 400.

While the present claim scope has been described with reference to specific examples, which are intended to be illustrative only and not to be limiting of the claim scope, it will be apparent to those of ordinary skill in the art that changes, additions and/or deletions may be made to the disclosed embodiments without departing from the spirit and scope of the claims.

The foregoing description is given for clearness of understanding only, and no unnecessary limitations should be understood therefrom, as modifications within the scope of the claims may be apparent to those having ordinary skill in the art.

Claim Support Section

In a first embodiment, a device comprises a motherboard, a backing layer, a battery, a display module, and an individual piece of thermally conductive material comprising a first surface and a second surface, wherein a first section of the thermally conductive material is positioned between the motherboard and the backing layer such that the first surface of the first section is adjacent to the motherboard and the second surface of the first section is adjacent to the backing layer, and wherein a second section of the thermally conductive material is positioned between the display module and the battery of the electronic device such that the first surface of the second section is adjacent to a back plate of the display module and the second surface of the second section is adjacent to the battery.

In a second embodiment, a device comprises a display module having a conductive back plate, a backing layer, a motherboard positioned between the back plate of the display module and the backing layer, a battery positioned between the back plate of the display module and the backing layer, and a heat spreader comprising a first surface and a second surface, wherein a first section of the heat spreader is positioned between the motherboard and the backing layer such that the first surface of the first section is adjacent to the motherboard and the second surface of the first section is contacting the backing layer, and wherein a second section of the heat spreader is positioned between the back plate of the display module and the battery such that the first surface of the second section is contacting the back plate and the second surface of the second section is adjacent to the battery.

In a third embodiment, with reference to the first or second embodiment, the thermally conductive material or heat spreader comprises graphite.

In a fourth embodiment, with reference to any of embodiments 1-3, the first section of the thermally conductive material or heat spreader lies in a first plane and the second section of the thermally conductive material or heat spreader lies in a second plane, separate from and parallel with the first plane, and the first section and the second section are joined by a connecting section of the thermally conductive material.

In a fifth embodiment, with reference to the fourth embodiment, the connecting section of the thermally conductive material or heat spreader lies in a third plane, and an angle of inclination from the first plane to the third plane is 10 degrees or less.

In a sixth embodiment, with reference to any of embodiments 1-5, the thermally conductive material or heat spreader is configured to transfer heat generated between the first and second sections of the thermally conductive material or heat spreader (such as from the motherboard to the back plate of the display module).

In a seventh embodiment, with reference to the sixth embodiment, the heat spreader is an individual piece of thermally conductive material.

In an eighth embodiment, with reference to any of embodiments 1-7, the device further comprises a compressible layer positioned between the second surface of the second section of the thermally conductive material or heat spreader and the battery.

In a ninth embodiment, with reference to the eighth embodiment, the compressible layer comprises an opening in a center of the compressible layer, wherein the opening is configured to provide an area for the battery to expand in a direction of the back plate.

In a tenth embodiment, with reference to the eighth or ninth embodiment, the device further comprises a first adhesive layer positioned between the second surface of the second section of the thermally conductive material or heat spreader and the compressible layer, and a second adhesive layer positioned between the compressible layer and the battery.

In an eleventh embodiment, with reference to any of embodiments 1-10, the device further comprises a vapor chamber, heat sink, heat fin, or heat pipe positioned between the motherboard and the first surface of the first section of the thermally conductive material or heat spreader.

In a twelfth embodiment, with reference to any of embodiments 1-11, the conductive back plate of the display module comprises aluminum or stainless steel.

In a thirteenth embodiment, a method of making a heat dissipating apparatus for an electronic device is provided, wherein the method comprises: providing an individual piece of thermally conductive material having a first surface and a second surface; adhering a first section of the thermally conductive material at the first surface to a motherboard or to a vapor chamber, heat sink, heat fin, or heat pipe positioned between the motherboard and the first section of the thermally conductive material; affixing a second section of the thermally conductive material at the second surface to a battery or to a compressible layer positioned between the battery and the second section of the thermally conductive material; and contacting at least a portion of the second section of the thermally conductive material at the first surface with a back plate of a display module of the electronic device.

In a fourteenth embodiment, with reference to the thirteenth embodiment, the method further comprises bonding at least a portion of the first section of the thermally conductive material at the second surface to a backing layer of the electronic device.

In a fifteenth embodiment, with reference to the thirteenth or fourteenth embodiment, the method further comprises shaping the thermally conductive material such that the first section of the thermally conductive material lies in a first plane and the second section of the thermally conductive material lies in a second plane, separate from and parallel with the first plane, and wherein the first section and the second section are joined by a connecting section of the thermally conductive material.

In a sixteenth embodiment, with reference to any of embodiments 13-15, the compressible layer is a foam layer, the second section of the thermally conductive material at the second surface is affixed to the foam layer, and the foam layer is configured to press the second section of the thermally conductive material against the back plate of the display module.

What is claimed is:

1. A device comprising:
   a motherboard;
   a backing layer;
   a battery;
   a display module; and
   an individual piece of thermally conductive material comprising a first surface and a second surface,
   wherein a first section of the thermally conductive material is positioned between the motherboard and the backing layer such that the first surface of the first section is adjacent to the motherboard and the second surface of the first section is adjacent to the backing layer,
   wherein a second section of the thermally conductive material is positioned between the display module and the battery of the electronic device such that the first surface of the second section is adjacent to a back plate of the display module and the second surface of the second section is adjacent to the battery,
   wherein the first section of the thermally conductive material lies in a first plane and the second section of the thermally conductive material lies in a second plane, separate from and parallel with the first plane, and
   wherein the first section and the second section are joined by a connecting section of the thermally conductive material.

2. The device of claim 1, wherein the thermally conductive material comprises graphite.

3. The device of claim 1, wherein the connecting section of the thermally conductive material lies in a third plane, and wherein an angle of inclination from the first plane to the third plane is 10 degrees or less.

4. The device of claim 1, wherein the thermally conductive material is configured to transfer heat generated from the motherboard to the back plate of the display module.

5. A device comprising:
   a display module having a conductive back plate;
   a backing layer;
   a motherboard positioned between the back plate of the display module and the backing layer;

a battery positioned between the back plate of the display module and the backing layer;

a heat spreader comprising a first surface and a second surface, wherein a first section of the heat spreader is positioned between the motherboard and the backing layer such that the first surface of the first section is adjacent to the motherboard and the second surface of the first section is contacting the backing layer, and wherein a second section of the heat spreader is positioned between the back plate of the display module and the battery such that the first surface of the second section is contacting the back plate and the second surface of the second section is adjacent to the battery; and a compressible layer positioned between the second surface of the second section of the heat spreader and the battery, wherein the compressible layer comprises an opening in a center of the compressible layer, wherein the opening is configured to provide an area for the battery to expand in a direction of the back plate.

6. The device of claim 5, wherein the heat spreader is an individual piece of thermally conductive material.

7. The device of claim 6, wherein the thermally conductive material comprises graphite.

8. The device of claim 5, wherein the first section of the heat spreader lies in a first plane and the second section of the heat spreader lies in a second plane, separate from and parallel with the first plane, and wherein the first section and the second section are joined by a connecting section of the heat spreader.

9. The device of claim 8, wherein the connecting section of the heat spreader lies in a third plane, and wherein an angle of inclination from the first plane to the third plane is 10 degrees or less.

10. The device of claim 5, wherein the heat spreader is configured to transfer heat generated from the motherboard to the back plate of the display module.

11. The device of claim 5, further comprising:

a first adhesive layer positioned between the second surface of the second section of the heat spreader and the compressible layer; and a second adhesive layer positioned between the compressible layer and the battery.

12. The device of claim 5, further comprising:

a vapor chamber, heat sink, heat fin, or heat pipe positioned between the motherboard and the first surface of the first section of the heat spreader.

13. The device of claim 5, wherein the conductive back plate of the display module comprises aluminum or stainless steel.

14. A device comprising:

a backing layer;

a display module; and an individual piece of thermally conductive material comprising a first surface and a second surface, wherein a first section of the thermally conductive material is positioned adjacent to the backing layer, wherein a second section of the thermally conductive material is positioned adjacent to a back plate of the display module, wherein the first section of the thermally conductive material lies in a first plane and the second section of the thermally conductive material lies in a second plane, separate from and parallel with the first plane, and wherein the first section and the second section are joined by a connecting section of the thermally conductive material.

15. The device of claim 14, wherein the connecting section of the thermally conductive material lies in a third plane, and wherein the angle of inclination from the first plane to the third plane is 10 degrees or less.

16. The device of claim 15, wherein the thermally conductive material is configured to transfer heat generated from a heat source positioned adjacent to the first section of the thermally conductive material to the back plate of the display module.

17. The device of claim 16, wherein the thermally conductive material comprises graphite.

18. The device of claim 14, wherein the thermally conductive material is configured to transfer heat generated from a heat source positioned adjacent to the first section of the thermally conductive material to the back plate of the display module.

19. The device of claim 18, wherein the thermally conductive material comprises graphite.

20. The device of claim 14, wherein the thermally conductive material comprises graphite.

* * * * *